(12) United States Patent
Choi

(10) Patent No.: US 7,045,891 B2
(45) Date of Patent: May 16, 2006

(54) SOCKETS FOR MODULE EXTENSION AND MEMORY SYSTEM USING SAME

(75) Inventor: Jung-Hwan Choi, Kyungki-do (KR)

(73) Assignee: Samsung Electronic Co., Ltd., Suwon-si (KR)

( * ) Notice: Subject to any disclaimer, the term of this patent is extended or adjusted under 35 U.S.C. 154(b) by 500 days.

(21) Appl. No.: 09/978,497

(22) Filed: Oct. 16, 2001

(65) Prior Publication Data

US 2002/0043718 A1    Apr. 18, 2002

(30) Foreign Application Priority Data

Oct. 16, 2000   (KR) ................................ 2000-60705

(51) Int. Cl.
    *H01L 23/34*        (2006.01)
(52) U.S. Cl. .................... 257/723; 257/726; 257/727; 439/61; 439/65
(58) Field of Classification Search ................ 257/723, 257/686, 691, 693, 726, 727, 730; 439/61, 439/62, 65, 72, 76, 89, 83, 632, 629, 876, 439/701, 908, 945, 631, 71, 74, 79, 637, 439/69; 361/785; 359/118, 154; 357/40
    See application file for complete search history.

(56) References Cited

U.S. PATENT DOCUMENTS

| | | | | |
|---|---|---|---|---|
| 3,736,471 A * | 5/1973 | Donze et al. ................ 361/684 |
| 4,850,891 A * | 7/1989 | Walkup et al. ............... 439/326 |
| 5,355,282 A * | 10/1994 | Yokemura et al. ........... 361/760 |
| 5,530,623 A * | 6/1996 | Sanwo et al. ................ 361/788 |
| 5,788,510 A * | 8/1998 | Walker ......................... 439/61 |
| 6,109,929 A * | 8/2000 | Jasper .......................... 439/74 |
| 6,122,161 A * | 9/2000 | Gierut ......................... 361/683 |
| 6,222,739 B1 * | 4/2001 | Bhakta et al. ............... 361/790 |
| 6,246,588 B1 * | 6/2001 | Kim et al. ................... 361/786 |
| 6,317,352 B1 * | 11/2001 | Halbert et al. ................ 365/52 |
| 6,324,071 B1 * | 11/2001 | Weber et al. ................ 361/785 |
| 6,382,983 B1 * | 5/2002 | Koyama et al. .............. 439/62 |
| 6,382,986 B1 * | 5/2002 | Kim et al. .................... 439/74 |
| 6,392,897 B1 * | 5/2002 | Nakase et al. .............. 361/785 |
| 6,406,332 B1 * | 6/2002 | Buican et al. .............. 439/631 |
| 6,542,373 B1 * | 4/2003 | Oba ........................... 361/760 |

\* cited by examiner

*Primary Examiner*—Zandra V. Smith
*Assistant Examiner*—Khanh Duong
(74) *Attorney, Agent, or Firm*—Marger Johnson & McCollom, P.C.

(57) ABSTRACT

A through socket includes a socket body, which can load the plurality of memory modules, and a plurality of internally connected socket conductors arranged to electrically connect the memory modules when loaded. A turn around socket includes a socket body for loading at least one memory module and connecting a contact of one surface of a loaded memory module to a contact of the other surface. Using at least one through socket and at least one turn around socket, the memory system can extend a plurality of memory modules on a printed circuit board (PCB). A memory module adapted for use in the memory system has four contacts arranged at both ends and on both surfaces.

7 Claims, 13 Drawing Sheets

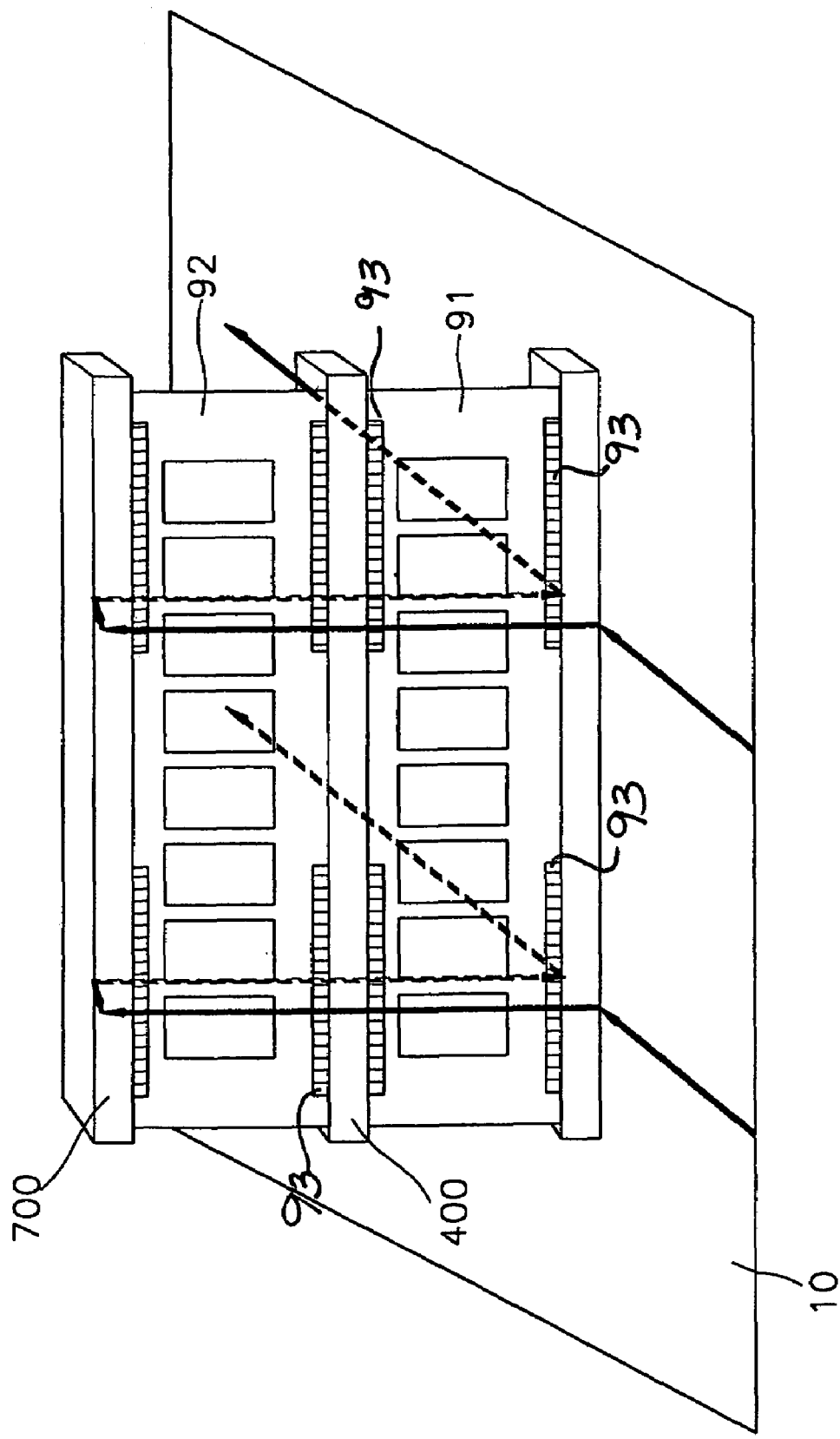

SOCKETS FOR MODULE EXTENSION AND MEMORY SYSTEM USING SAME

This application claims priority from Korean Patent Application No. 00-60705, filed Oct. 16, 2000 in the name of Samsung Electronics Co., Ltd., which is herein incorporated by reference.

BACKGROUND OF THE INVENTION

1. Field of the Invention

The present invention relates to a wiring connection apparatus of an electronic device, and more particularly, to a socket, occupying a small area of a printed circuit board (PCB), enabling a plurality of modules to be easily extended, and a memory system using the socket.

2. Description of the Related Art

Computer systems often require graphics of high quality, requiring that the integration density and speed of a semiconductor memory device must be increased and the size of a semiconductor memory device must be reduced. A memory module changes corresponding to the changes in the semiconductor memory device. In particular, since a greater amount of memory than the amount used in conventional technology is required for real time processing of three dimensional data, a greater number of memory module boards must be loaded on a main board.

FIG. 1 shows a first example of conventional sockets loaded on a printed circuit board (PCB) and memory modules connected to the sockets. A PCB 10 includes two conventional sockets 11 and 12 installed to be parallel with each other and two conventional memory modules 13 and 14 loaded on the sockets 11 and 12.

The memory modules 13 and 14 connected to the two conventional sockets 11 and 12 are connected to a central processing unit (not shown) in parallel through a plurality of data bus lines 15 and a plurality of signal lines 16.

FIG. 2 shows a second example of conventional sockets loaded on a PCB and memory modules connected to the sockets. The PCB 10 includes two conventional sockets 11 and 12 installed to be parallel with each other on the PCB 10 and two memory modules 23 and 24 connected to the conventional sockets 11 and 12.

The memory modules 23 and 24 connected to the sockets 11 and 12 are serially connected to the CPU (not shown) through the plurality of data bus lines 15 and the plurality of signal lines 16. In this example, the memory modules 23 and 24 are formed so that the data bus lines 15 and signal lines 16 run up along on one side and down the opposite side via a path (indicated by the solid-and-dotted lines).

FIGS. 3A and 3B are sectional views showing base sockets for loading memory modules used in a conventional PCB. FIG. 3A shows a base socket where the memory module is loaded parallel to the PCB. FIG. 3B shows a base socket where the memory module is loaded perpendicular to the PCB.

Referring to FIGS. 3A and 3B, the base sockets are attached to a PCB 34 by soldering socket fixing means 32 included in the base sockets.

The base sockets include socket bodies 30a and 30b and two socket conductors 33 for connecting the contacts of both surfaces of a memory module board 31. The two socket conductors 33 pass through the insides of the socket bodies 30a and 30b and are connected to corresponding printed circuit patterns (not shown) of the PCB 34.

Referring to FIGS. 1 through 3B, the number of memory modules used in a conventional system board is restricted by the number of sockets loaded on the system board (that is, the PCB) and installed so as to connect to the memory modules. When four sockets are loaded, the number of memory modules that can be loaded is restricted to four. The number of memory modules cannot be increased or decreased. When a user needs to use only two memory modules, the remaining two sockets are wasted.

Therefore, when a significantly large number of sockets for the memory modules are installed, the size of the PCB is large. When a small number of sockets for the memory modules are installed, it is difficult to extend memory capacity.

SUMMARY OF THE INVENTION

The present disclosure provides a through socket and a turn around socket, designed to extend a plurality of memory modules without increasing the size of a printed circuit board (PCB). The disclosure further provides a memory system for extending a plurality of memory modules using the sockets.

A through socket includes a socket body, arranged to load first and second memory modules, and a first conductor, arranged to connect a contact on one surface of the first memory module to a contact on one surface of the second memory module. The through socket further comprises a second conductor arranged to connect a contact on the other surface of the first memory module to a contact on the other surface of the second memory module.

A turn around socket comprises a socket body arranged to load a first memory module, and a first conductor arranged to connect a contact on one surface of the first memory module to a contact on the other surface of the first memory module.

A memory system according to the present disclosure includes a plurality of memory modules. At least one through socket is provided for electrically connecting at least two memory modules of the plurality of memory modules. As well, the memory system further includes at least one turn around socket for electrically connecting at least one surface of one of the plurality of memory modules to the other surface of the same memory module.

A memory module adapted for use in the present memory system comprises a printed circuit board having first and second surfaces and first and second ends. A plurality of memory devices are loaded on the first and second surfaces of the memory module. Four contacts are arranged at the first and second ends of the first and second surfaces of the memory module, the contacts being operative as electrical paths.

The present invention will become more apparent by describing in detail preferred embodiments thereof with reference to the attached drawings, in which the same reference numerals in different drawings represent the same element.

BRIEF DESCRIPTION OF THE DRAWINGS

FIGS. 9A, 9B, and 9C show a first applied example of the first embodiment of the through socket and the first embodiment of the turn around socket, the electrical connection of the first applied example, and a three dimensional perspective of a real PCB, respectively;

DETAILED DESCRIPTION OF THE EMBODIMENTS

Figure 1:
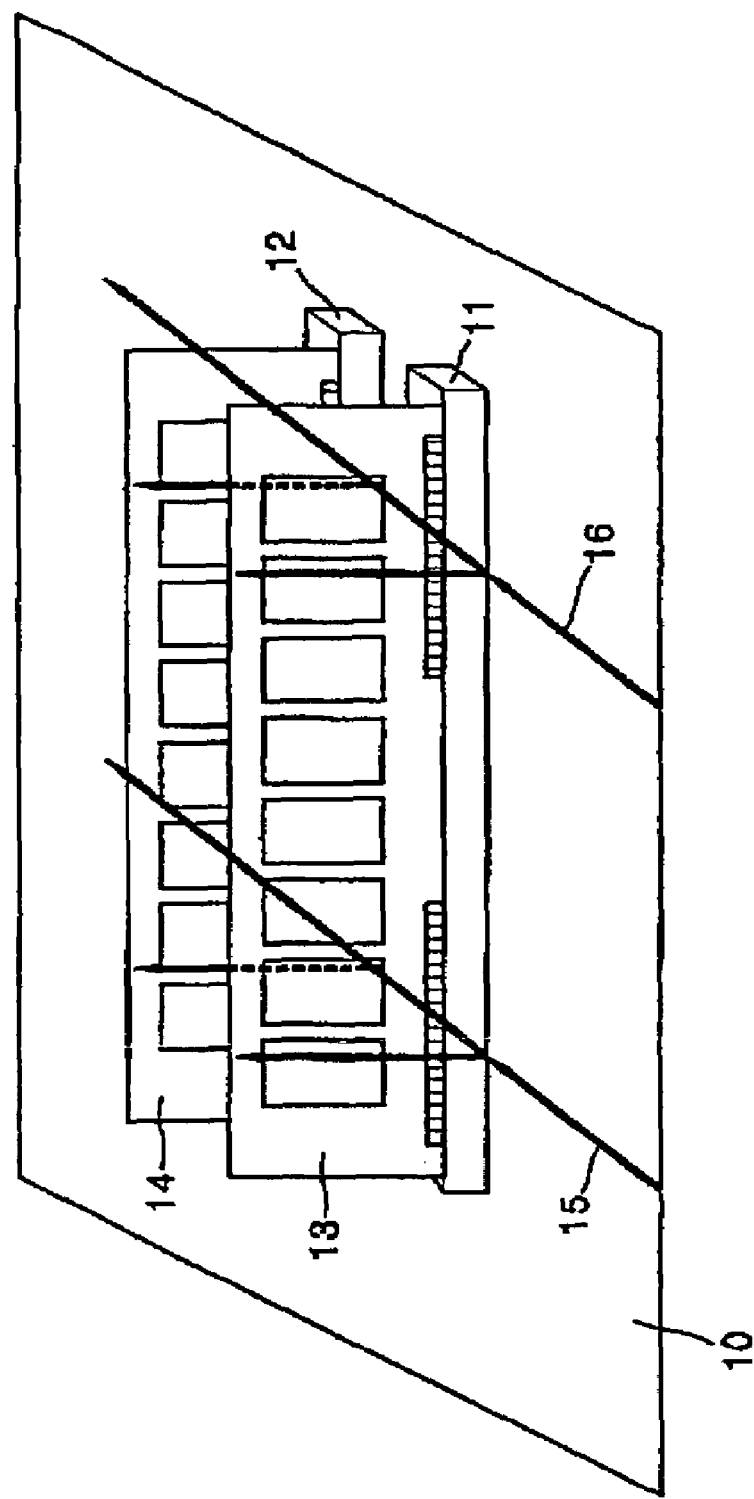
FIG. 1 shows a first example of conventional sockets loaded on a printed circuit board (PCB) and memory modules connected to the sockets.
Figure 2:
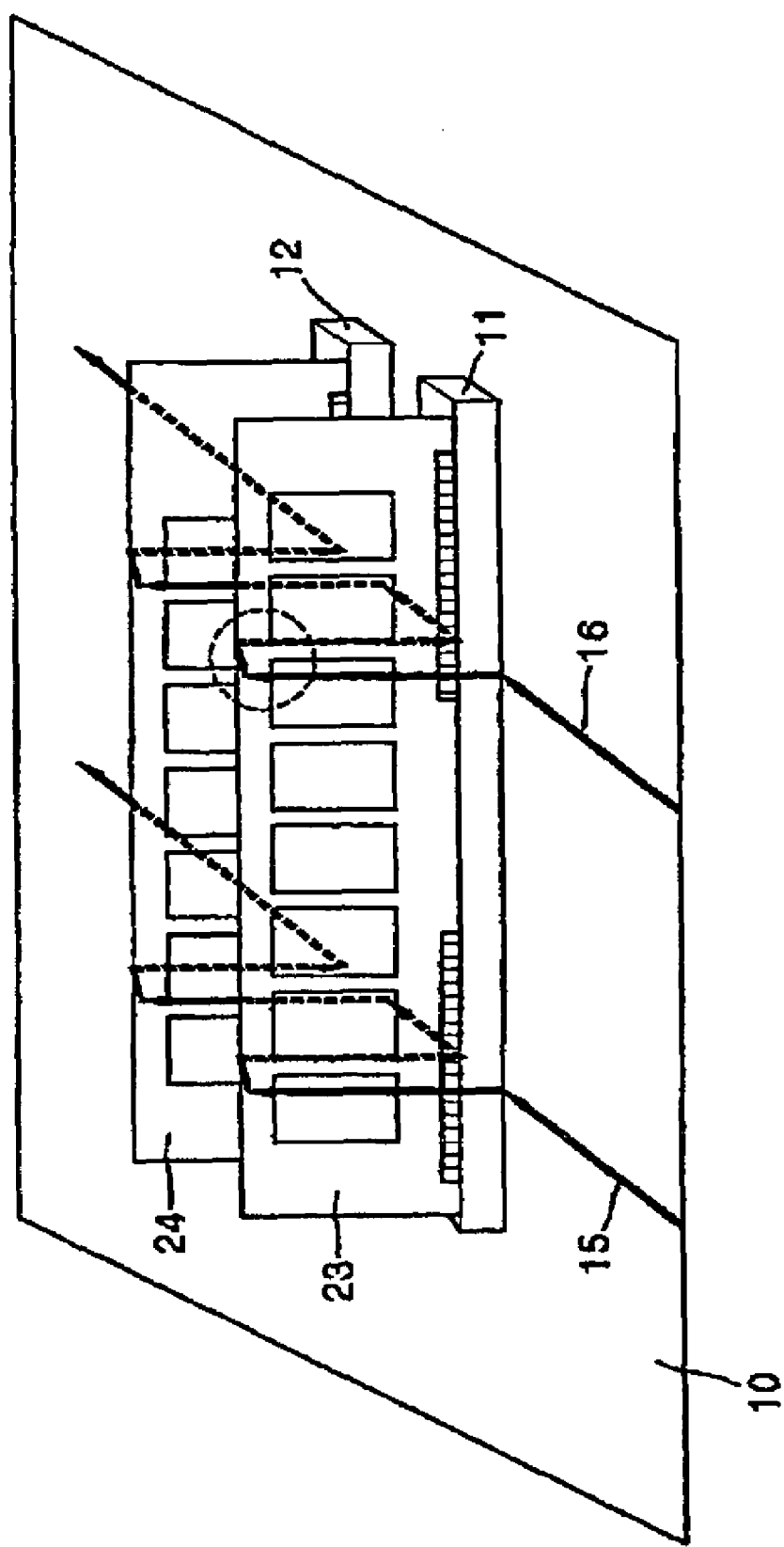
FIG. 2 shows a second example of conventional sockets loaded on a PCB and memory modules connected to the sockets.
Figure 3A:
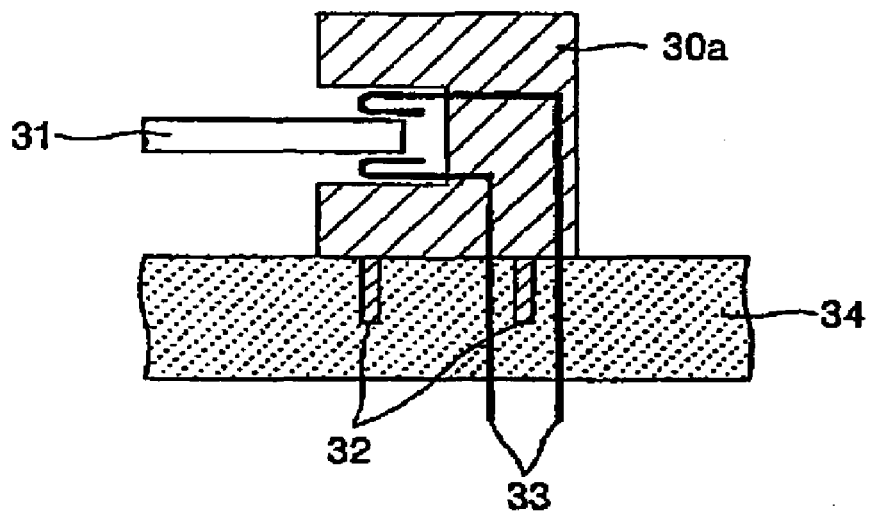
FIGS. 3A and 3B are sectional views of conventional sockets for loading memory modules used in the PCB.
Figure 3B:
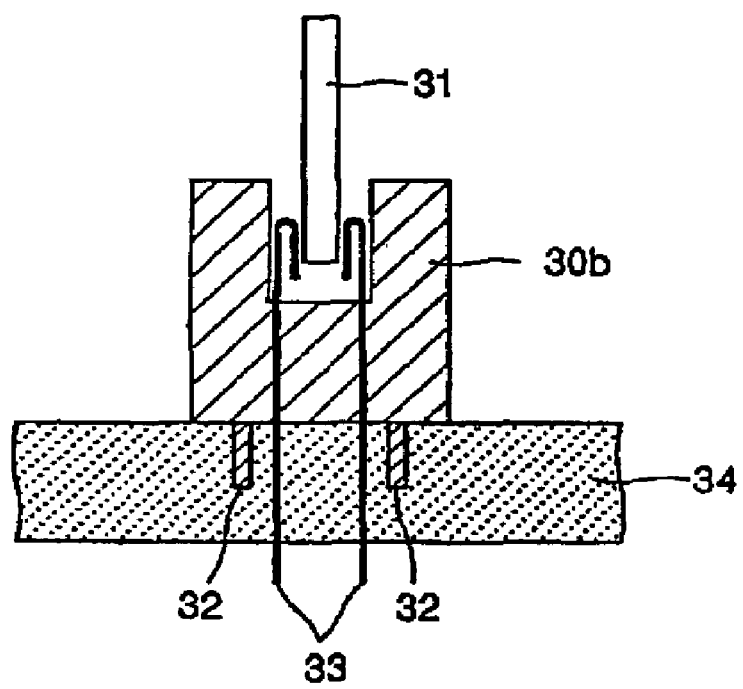
Figure 4:
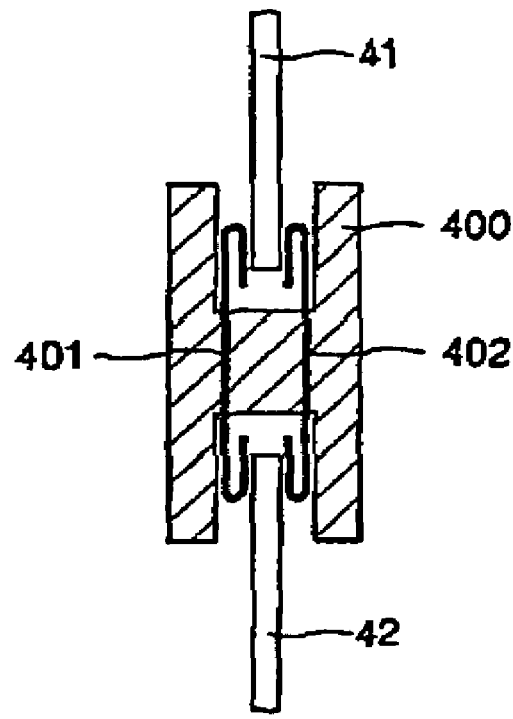
FIG. 4 is a sectional view of a through socket according to a first embodiment of the present invention.

A through socket according to one embodiment of the present invention is shown in sectional side view in FIG. 4. The through socket includes a socket body 400 for loading a first memory module 41 and a second memory module 42 in opposite directions. A first socket conductor 401 electrically connects a contact located on one surface of the first memory module 41 to a contact located on one surface of the second memory module 42 by passing through the socket body 400. A second socket conductor 402 electrically connects a contact located on the other surface of the first memory module 41 to a contact located on the other surface of the second memory module 42 by passing through the socket body 400.

Figure 5:
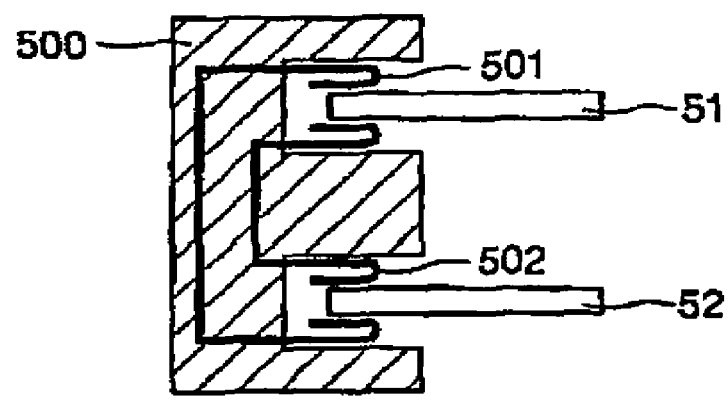
FIG. 5 is a sectional view of a through socket according to a second embodiment of the present invention.

Referring to FIG. 5, another embodiment of the through socket includes a socket body 500 for loading a first memory module 51 and a second memory module 52 in the same direction. A first socket conductor 501 electrically connects a contact located on one surface of the first memory module 51 to a contact located on one surface of the second memory module 52 by passing through the socket body 500. A second socket conductor 502 electrically connects a contact located on the other surface of the first memory module 51 to a contact located on the other surface of the second memory module 52 by passing through the socket body 500.

Figure 6:
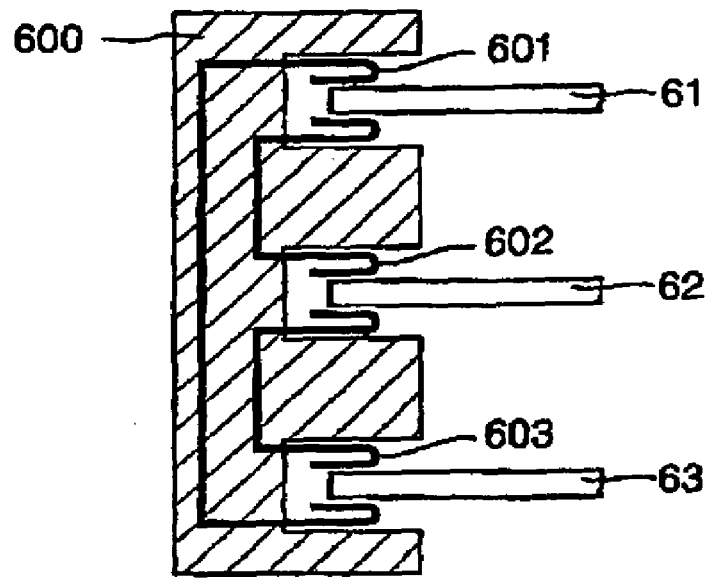
FIG. 6 is a sectional view of a through socket according to a third embodiment of the present invention.

A third through socket embodiment is shown in sectional view in FIG. 6. The through socket includes a socket body 600 for loading a first memory module 61, a second memory module 62, and a third memory module 63 in the same direction. A first socket conductor 601 electrically connects a contact located on one surface of the first memory module 61 to a contact located on one surface of the third memory module 63 by passing through the socket body 600. A second socket conductor 602 electrically connects a contact located on the other surface of the first memory module 61 to a contact located on one surface of the second memory module 62 by passing through the socket body 600. A third socket conductor 603 electrically connects a contact located on the other surface of the second memory module 62 to a contact located on the other surface of the third memory module 63. The advantage of the daisy-chain configuration of the electrical connections, as exemplified in FIG. 6, is discussed in the several applied examples, below.

Figure 7:
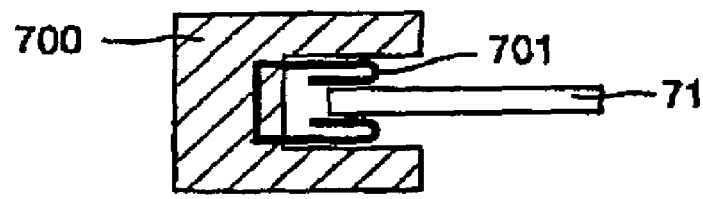
FIG. 7 is a sectional view of a turn around socket according to a first embodiment of the present invention.

A turn around socket according to one embodiment of the present invention is shown in FIG. 7. The turn around socket includes a socket body 700 for loading a memory module 71 and a first socket conductor 701 for electrically connecting the contacts (93, FIG. 9C) of both sides of the memory module 71 by passing through the socket body 700.

Figure 8:
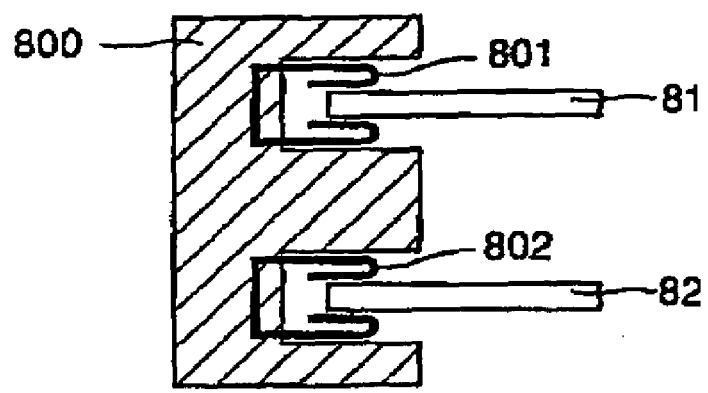
FIG. 8 is a sectional view of a turn around socket according to a second embodiment of the present invention.

Referring to a second embodiment turn around socket (FIG. 8), the turn around socket similarly includes a socket body 800 for loading a first memory module 81 and a second memory module 82 in the same direction, a first socket conductor 801 for electrically connecting the contacts of both surfaces of the first memory module 81 by passing through the socket body 800, and a second socket conductor 802 for electrically self-connecting the contacts of both surfaces of the second memory modules 82 by passing through the socket body 800.

Figure 9A:
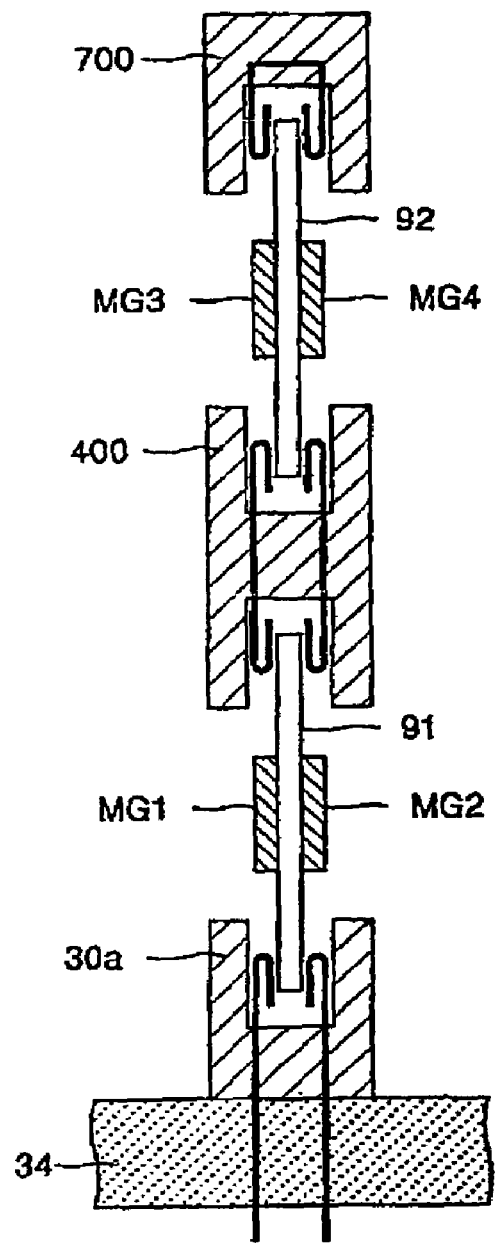
Figure 9B:
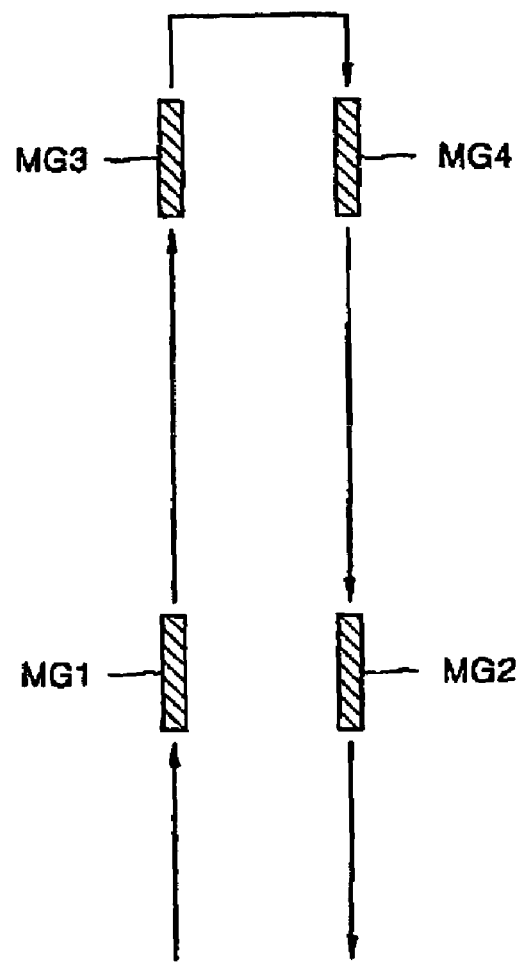

FIG. 9A is a sectional side view showing a first applied example of the first embodiment of the through socket and the first embodiment of the turn around socket. FIG. 9B diagrams the electrical connection of the first applied example shown in FIG. 9A. FIG. 9C is a perspective view showing the first applied example on a printed circuit board (PCB).

Turning now to FIG. 9A, the first applied example comprises a first memory module 91 loaded in a base socket 30a installed on a PCB 34. The first memory module 91 is connected to a second memory module 92 by a through socket 400. A turn around socket 700 is loaded on the upper portion of the second memory module 92.

In the first applied example (FIG. 9A), memory groups MG1 through MG4 are electrically and serially connected to each other in the following order: MG1, MG3, MG4, and MG2 (FIG. 9B). An electrical connection in the reverse order is also possible. Memory groups MG1 through MG4 refer to the set of a plurality of memories loaded on both surfaces of the memory modules.

In use, a first memory module 91 is loaded in a base socket loaded on a PCB 10 (FIG. 9C). The through socket 400 is installed between the first memory module 91 and the second memory module 92. The turn around socket 700 is loaded on the upper portion of the second memory module 92.

In a second applied example (FIG. 10A), the first memory module 91 is loaded in a base socket 30b installed on a PCB 34. The first memory module 91 is connected to the second memory module 92 by the through socket 400. The turn around socket 700 is loaded at one end of the second memory module 92.

Figure 10A:
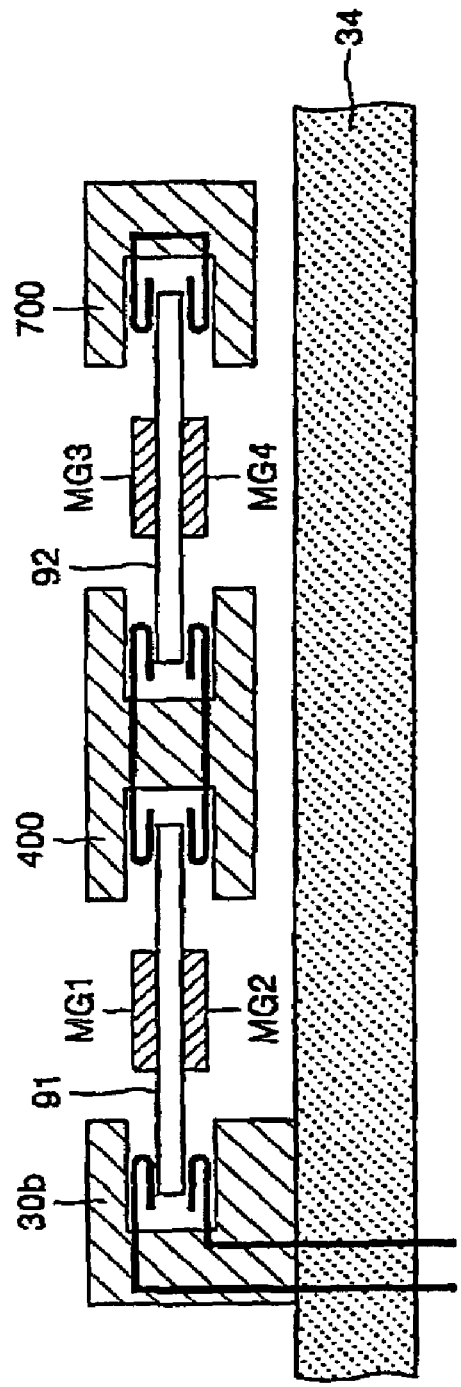
FIGS. 10A and 10B show a second applied example of the first embodiment of the through socket and the first embodiment of the turn around socket and the electrical connection of the second applied example, respectively.
Figure 10B:
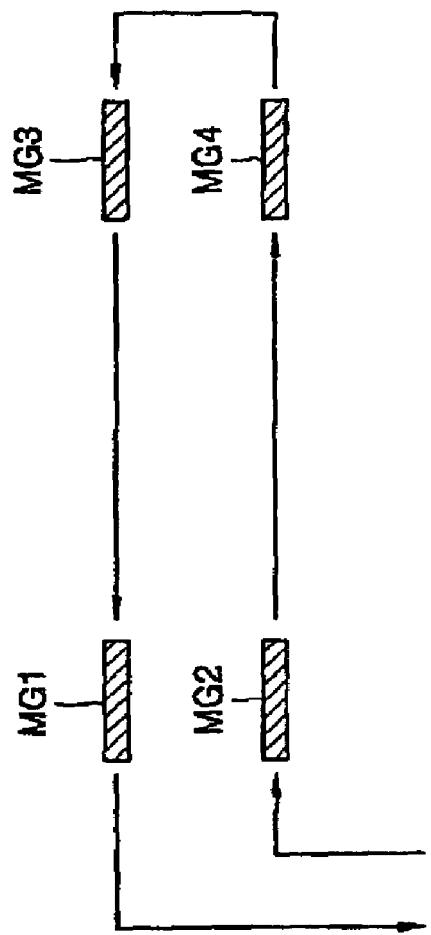

In the first embodiment shown in FIG. 10A, the memory groups MG1 through MG4 are electrically and serially connected to each other in the following order: MG2, MG4, MG3, and MG1 (FIG. 10B). An electrical connection in the reverse order is also possible.

Figure 11A:
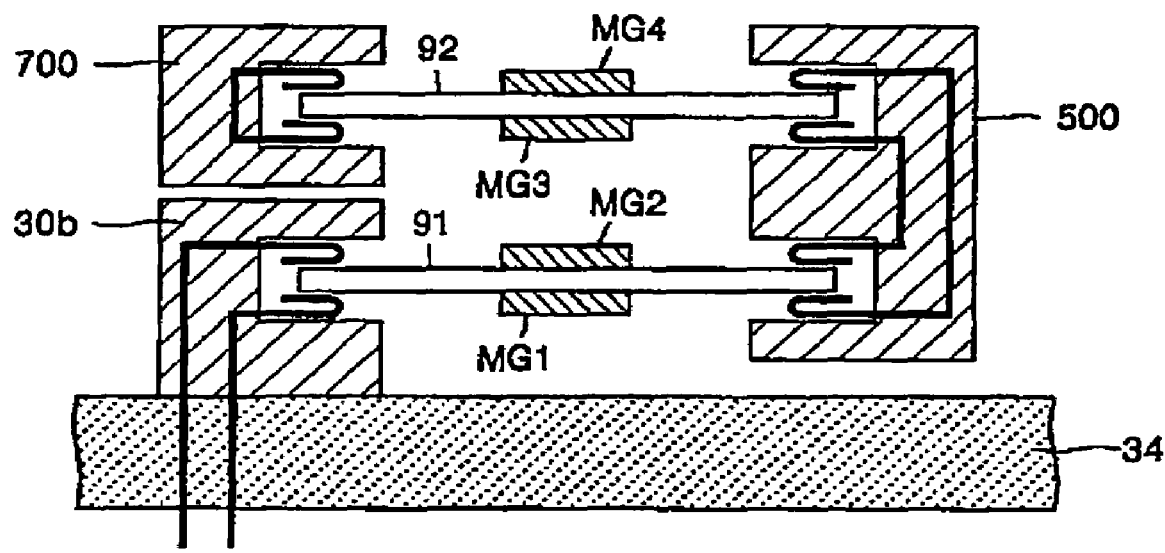
FIGS. 11A and 11B show a third applied example of the second embodiment of the through socket and the first embodiment of the turn around socket and the electrical connection of the third applied example, respectively.

FIG. 11A shows a third applied example of the second embodiment of the through socket and the first embodiment of the turn around socket. In this applied 5 example, the first memory module 91 is loaded in a base socket 30b installed on the PCB 34. The first memory module 91 is connected to the second memory module 92 by a through socket 500. The turn around socket 700 is loaded at one end of the second memory module 92.

Figure 11B:
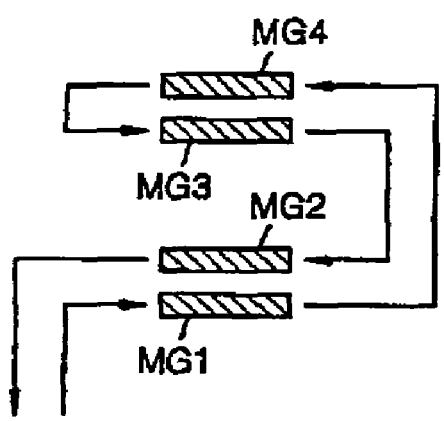

FIG. 11B shows the electrical connection of the third applied example shown in FIG. 11A. The memory groups MG1 through MG4 are electrically and serially connected to each other in the following order: MG1, MG4, MG3, and MG2. An electrical connection in the reverse order is also possible.

The first, second and third applied examples disclose various methods for loading two memory modules on a PCB in a vertical direction, horizontal direction, and horizontal and vertical directions, respectively.

Figure 12A:
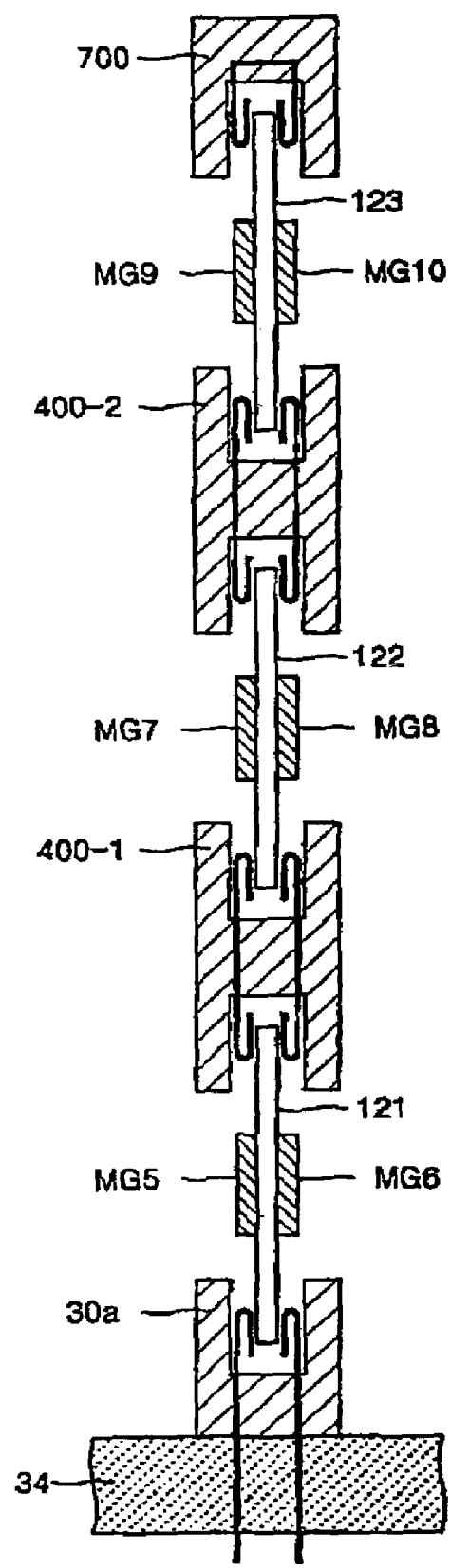
FIGS. 12A and 12B show a fourth applied example of the first embodiment of two through sockets and the first embodiment of the turn around socket and the electrical connection of the fourth applied example, respectively.

The present sockets and memory system can also be utilized to load three memory modules, as shown in a fourth applied example of the first embodiment of two through sockets and the first embodiment of the turn around socket (FIG. 12A). In the fourth applied example, a first memory module 121 is loaded in the base socket 30a installed on the PCB 34. The first memory module 121 is connected to a second memory module 122 by a through socket 400-1, and the second memory module 122 is connected to a third memory module 123 by a connection socket 400-2. The turn around socket 700 is loaded at one end of the third memory module 123.

Figure 12B:
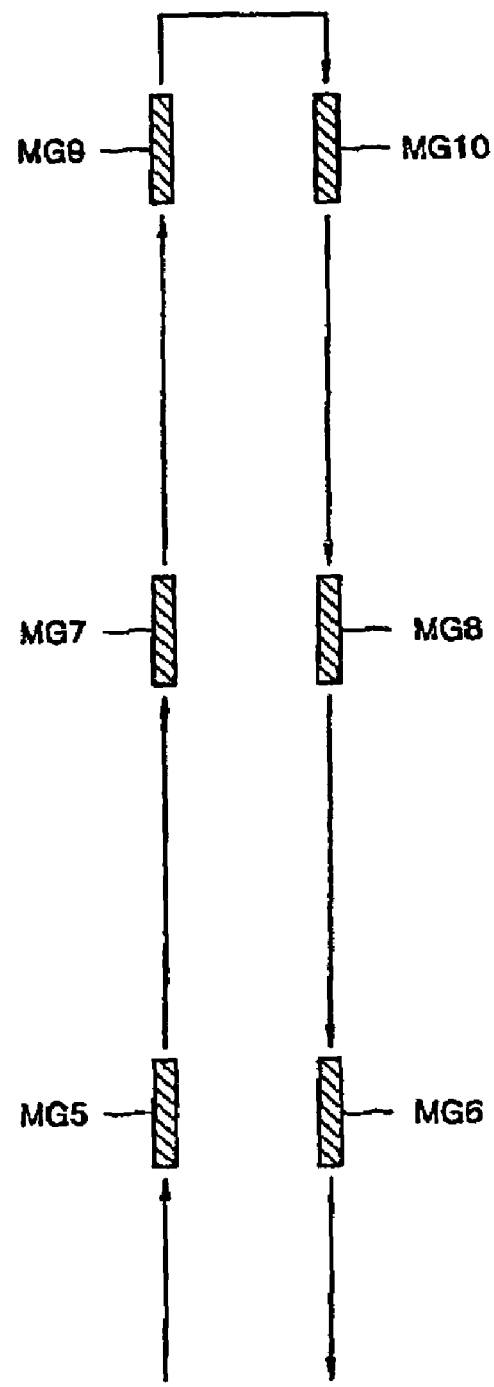

The electrical connection of the fourth applied example, above, is shown in FIG. 12B. Memory groups MG5 through MG10 are electrically and serially connected in the following order: MG5, MG7, MG9, MG10, MG8, and MG6. An electrical connection in the reverse order is also possible.

Figure 13A:
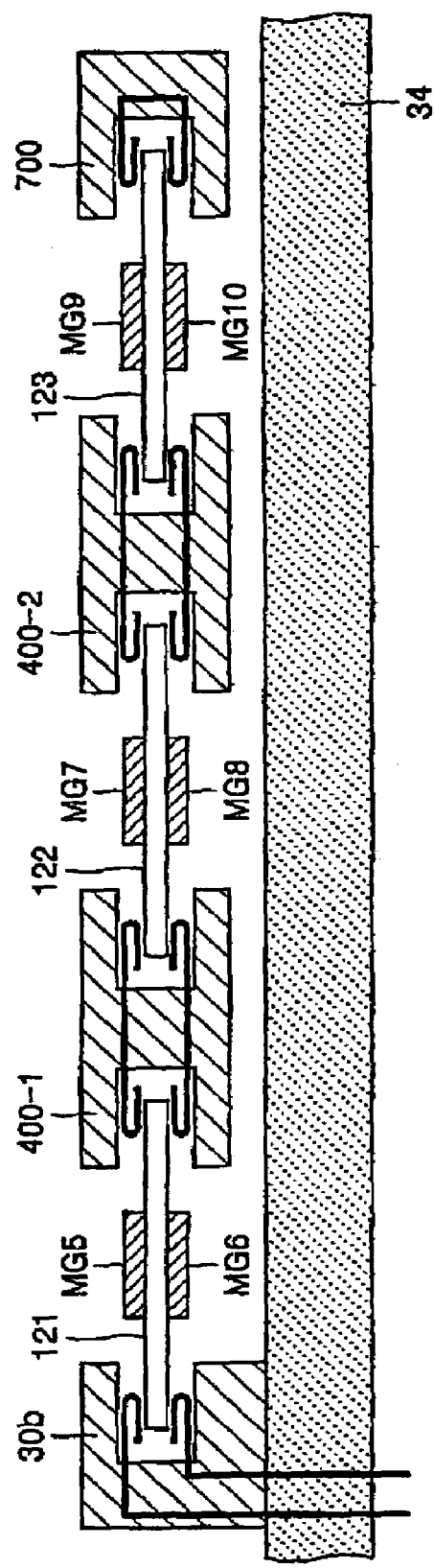
FIGS. 13A and 13B show a fifth applied example of the first embodiment of two through sockets and the first embodiment of the turn around socket and the electrical connection of the fifth applied example, respectively.
Figure 13B:
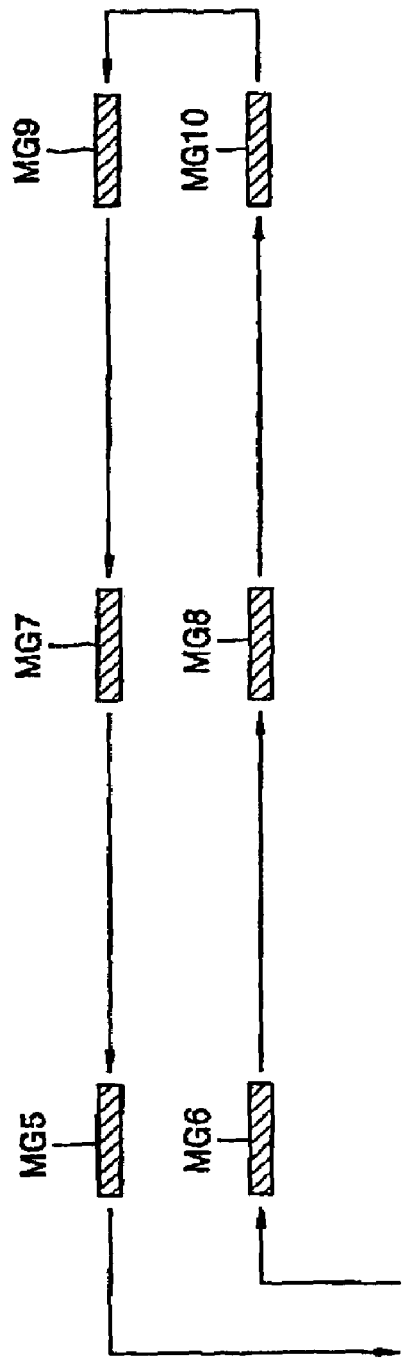

Similarly, FIG. 13A shows a fifth applied example of the first embodiment of two through sockets and the first embodiment of the turn around socket. FIG. 13B diagrams the electrical connection of the fifth applied example shown in FIG. 13A.

Referring to FIG. 13A, in the fifth applied example, the first memory module 121 is loaded in the base socket 30b installed on the PCB 34. The first memory module 121 is connected to the second memory module 122 by the through socket 400-1, and the second memory module 122 is connected to the third memory module 123 by the through socket 400-2. The turn around socket 700 is loaded at one end of the third memory module 123.

In the fifth applied example, memory groups MG5 through MG10 are electrically and serially connected in the following order: MG6, MG8, MG10, MG9, MG7, and MG5 (FIG. 13B). An electrical connection in the reverse order is also possible.

Figure 14A:
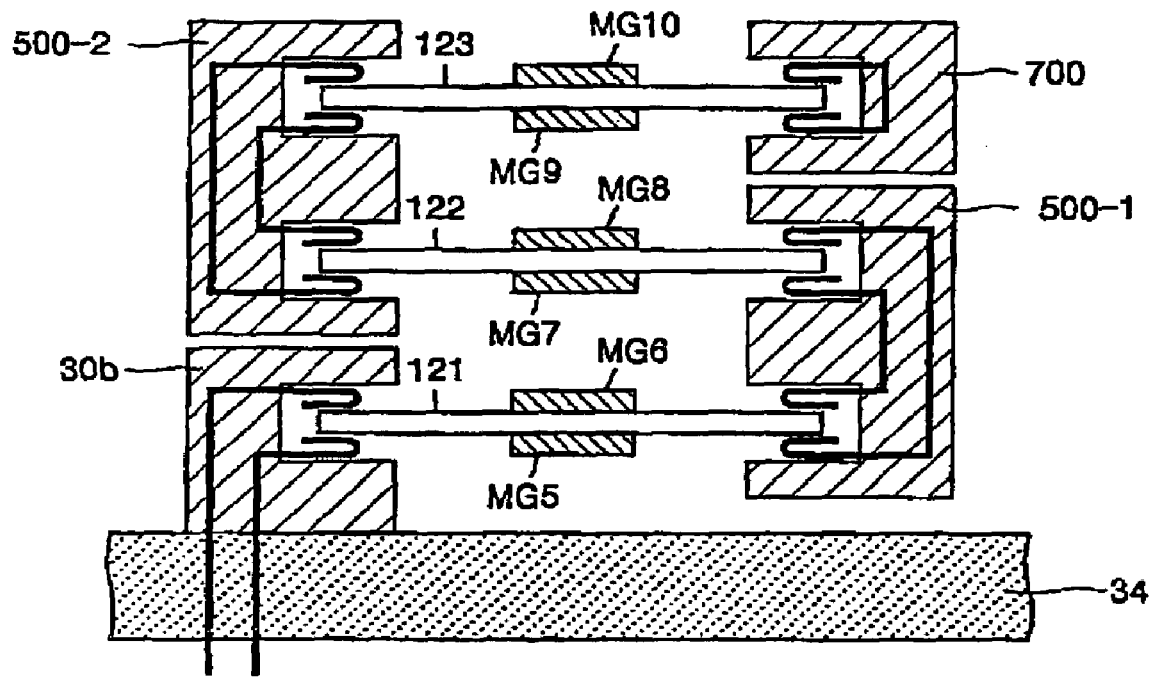
FIGS. 14A and 14B show a sixth applied example of the second embodiment of two through sockets and the first embodiment of the turn around socket and the electrical connection of the sixth applied example, respectively.

As shown in FIG. 14A, in the sixth applied example, the first memory module 121 is loaded in the base socket 30b installed on the PCB 34. The first memory module 121 is connected to the second memory module 122 by a through socket 500-1, and the second memory module 122 is connected to the third memory module 123 by a through socket 500-2. The turn around socket 700 is loaded at one end of the third memory module 123. The contacts of the memory modules loaded in sockets 500-1 and 500-2 are connected in a daisy-chain configuration.

Figure 14B:
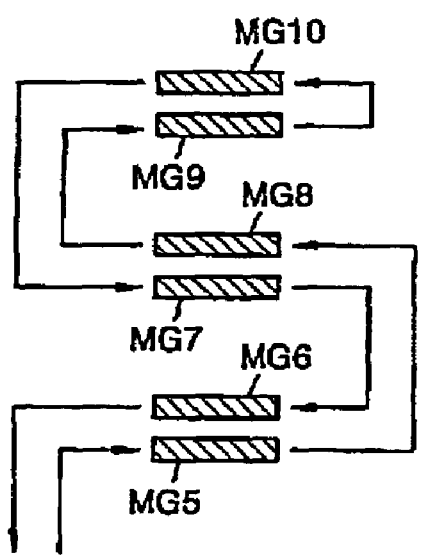

FIG. 14B shows the electrical connection of the sixth applied example shown in FIG. 14A. In the sixth applied example shown in FIG. 14A, memory groups MG5 through MG10 are electrically and serially connected to each other in the following order: MG5, MG8, MG9, MG10, MG7, and MG6. It should be apparent that an electrical connection in the reverse order is also possible.

Referring to FIG. 12A through FIG. 14B, the fourth through sixth applied examples disclose various methods of loading three memory modules on the PCB in the vertical direction, the horizontal direction, and the horizontal and vertical directions, respectively.

As shown in FIGS. 12A and 12B, since the plurality of through sockets and memory modules are serially connected, it is theoretically possible to infinitely extend the memory modules.

Figure 15A:
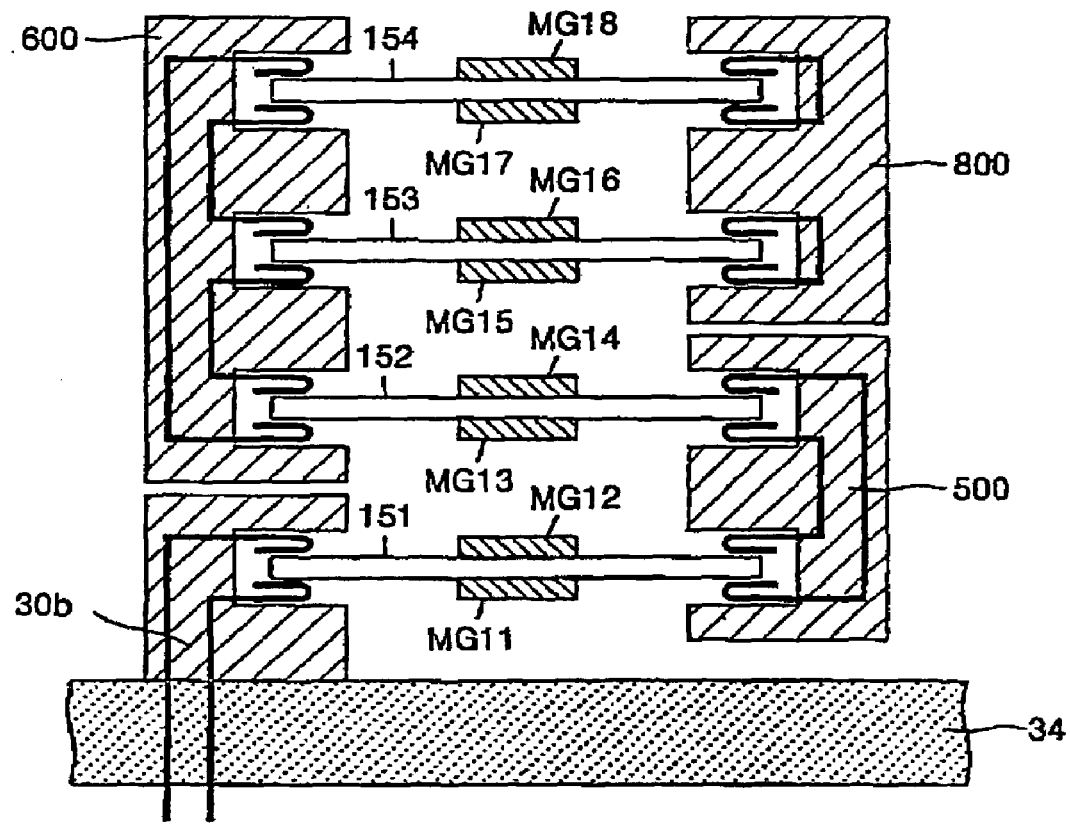
FIG. 15A shows a seventh applied example of the second embodiment of the through socket, the third embodiment of the through socket and the second embodiment of the turn around socket.

A seventh applied example of the second embodiment of the through socket, the third embodiment of the through socket, and the second embodiment of the turn around socket is shown in FIG. 15A. In the seventh applied example, a first memory module 151 is loaded in the base socket 30b installed on the PCB 34. The first memory module 151 is connected to a second memory module 152 by a through socket 500. The second memory module 152 is loaded in the lower stage of a through socket 600. A third memory module 153 is loaded in the middle stage of the through socket 600 and in the lower stage of the turn around socket 800. The fourth memory module 154 is loaded in the other stage of the turn around socket 800 and the upper stage of the third through socket 600. The contacts of the memory modules loaded in sockets 500 and 600 are connected in a daisy-chain configuration.

Figure 15B:
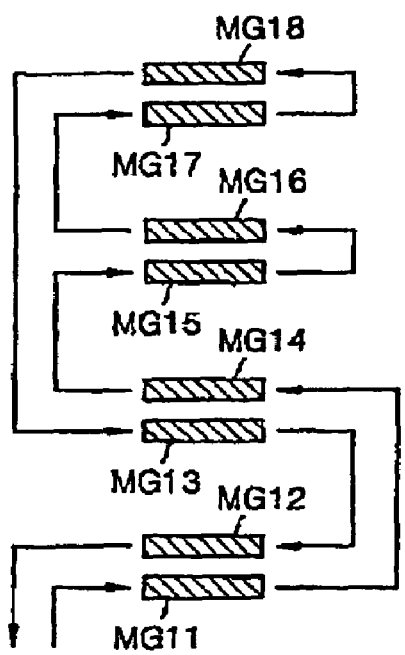
FIG. 15B shows the electrical connection of the seventh applied example.

FIG. 15B shows the electrical connection of the seventh applied example shown in FIG. 15A. Memory groups MG11 through MG18 are electrically and serially connected to each other in the following order: MG11, MG14, MG15, MG16, MG17, MG18, MG13, and MG12. As with other applied examples described above, an electrical connection in the reverse order is likewise possible.

Having described and illustrated the principles of the invention in a preferred embodiment thereof, it should be apparent that the invention can be modified in arrangement and detail without departing from such principles. Accordingly, such changes and modifications are considered to fall within the scope of the following claims.

The invention claimed is:

1. A socket, comprising:
    a socket body arranged to electrically connect a first memory module in series between a second memory module and a base socket that is electrically connected to the first memory module, the socket body arranged to load the first memory module and the second memory module;
    a first conductor arranged to connect a contact on a first surface of the first memory module to a contact on a first surface of the second memory module; and
    a second conductor arranged to connect a contact on a second surface of the first memory module to a contact on a second surface of the second memory module.

2. The socket of claim 1, the socket body arranged to load the first memory module and the second memory module such that the first memory module and the second memory module are aligned substantially with a single plane.

3. The socket of claim 1, the socket body arranged to load the first memory module and the second memory module such that the first memory module is substantially aligned with a first plane, the second memory module is substantially aligned with a second plane, and the first and second planes are substantially parallel to each other.

4. A through socket adapted to load a plurality of memory modules, comprising:
- a through socket body arranged to load a first memory module, a second memory module, and a third memory module, said first, second and third memory modules being loaded in a base socket mounted to a board;
- a first conductor arranged to connect a contact on a first surface of the first memory module to a contact on a first surface of the second memory module;
- a second conductor arranged to connect a contact on a second surface of the second memory module to a contact on the first surface of the third memory module; and
- a third conductor arranged to connect a contact on a second surface of the first memory module to a contact on a second surface of the third memory module;
- wherein the through socket is structured to load said memory modules either above or to the side of said base socket mounted on said board.

5. A memory module socket comprising:
- a socket body structured to electrically connect a first memory module having a first major surface and a second major surface in series between a second memory module having a first major surface and a second major surface and a base socket that is attached to a board, the socket body structured to be detachably affixed to the first and second memory modules along first edges of the first and second memory modules, the first memory module and the second memory module each having first contacts on the first major surface and second contacts on the second major surface;
- a first conductor structured to electrically connect one of the first contacts of the first memory module to a corresponding one of the first contacts of the second memory module; and
- a second conductor structured to electrically connect one of the second contacts of the first memory module to a corresponding one of the second contacts of the second memory module.

6. The memory module socket of claim 5, the socket body structured so that when the first memory module and second memory module are loaded in the socket body, a direction from the first edge of the first memory module towards a second edge of the first memory module is opposite a direction from the first edge of the second memory module towards a second edge of the second memory module, the second edge of the first memory module opposite the first edge of the first memory module, the second edge of the second memory module opposite the first edge of the second memory module.

7. The memory module socket of claim 5, the socket body structured so that when the first memory module and second memory module are loaded in the socket body, a direction from the first edge of the first memory module towards a second edge of the first memory module is the same as a direction from the first edge of the second memory module towards a second edge of the second memory module, the second edge of the first memory module opposite the first edge of the first memory module, the second edge of the second memory module opposite the first edge of the second memory module.

* * * * *

UNITED STATES PATENT AND TRADEMARK OFFICE
CERTIFICATE OF CORRECTION

PATENT NO.        : 7,045,891 B2                                    Page 1 of 1
APPLICATION NO.   : 09/978497
DATED             : May 16, 2006
INVENTOR(S)       : Jung-Hwan Choi It is certified that error appears in the above-identified patent and that said Letters Patent is hereby corrected as shown below:

Column 5, line 11, the words "5 example" should read -- example --.

Signed and Sealed this

Fourth Day of August, 2009

JOHN DOLL
*Acting Director of the United States Patent and Trademark Office*